US006309939B1

(12) United States Patent
Lee

(10) Patent No.: US 6,309,939 B1
(45) Date of Patent: Oct. 30, 2001

(54) METHOD OF MANUFACTURING A SEMICONDUCTOR DEVICE

(75) Inventor: Jung Ho Lee, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/596,278

(22) Filed: Jun. 16, 2000

(30) Foreign Application Priority Data

Jun. 18, 1999 (KR) ........................................ 99-22859

(51) Int. Cl.[7] ........................................ H01L 21/331

(52) U.S. Cl. .......................... 438/369; 438/162; 438/296; 257/336

(58) Field of Search .................................. 438/369, 162, 438/296; 257/336

(56) References Cited

U.S. PATENT DOCUMENTS

| | | | |
|---|---|---|---|
| 4,728,623 | 3/1988 | Lu et al. | 437/52 |
| 4,738,937 | 4/1988 | Parsons | 437/180 |
| 4,918,029 | 4/1990 | Kim | 437/119 |
| 5,004,702 | 4/1991 | Samata et al. | 437/52 |
| 5,030,583 | 7/1991 | Beetz | 437/39 |
| 5,032,538 | 7/1991 | Bozler et al. | 437/83 |
| 5,045,494 | 9/1991 | Choi et al. | 437/60 |
| 5,272,109 | 12/1993 | Motoda | 437/129 |
| 5,322,802 | 6/1994 | Baliga et al. | 437/22 |
| 5,322,814 | 6/1994 | Rouse et al. | 437/110 |
| 5,378,652 | 1/1995 | Samata et al. | 437/189 |
| 5,432,121 | 7/1995 | Chan et al. | 437/95 |
| 5,435,856 | 7/1995 | Rouse et al. | 136/225 |
| 5,489,791 * | 2/1996 | Arima et al. | 257/336 |
| 5,494,837 | 2/1996 | Subramanian et al. | 437/34 |
| 5,508,225 | 4/1996 | Kadoiwa | 437/129 |
| 5,567,652 | 10/1996 | Nishio | 437/200 |
| 5,599,724 | 2/1997 | Yoshida | 437/40 |
| 5,627,102 | 5/1997 | Shinriki et al. | 437/192 |
| 5,633,201 | 5/1997 | Choi | 438/620 |
| 5,744,377 | 4/1998 | Sekiguchi et al. | 438/674 |
| 5,773,350 | 6/1998 | Herbert et al. | 438/364 |
| 5,804,470 | 9/1998 | Wollesen | 438/141 |
| 6,054,355 * | 4/2000 | Inumiya et al. | 438/296 |
| 6,083,780 * | 7/2000 | Yasuda | 438/162 |
| 6,093,586 * | 7/2000 | Gosain et al. | 438/162 |

FOREIGN PATENT DOCUMENTS

| | | |
|---|---|---|
| 54-158880 | 12/1979 | (JP) . |
| 2-037745 | 2/1990 | (JP) . |
| 2-260667 | 10/1990 | (JP) . |
| 8-236728 | 7/1996 | (JP) . |
| 10-107219 | 4/1999 | (JP) . |
| 11-097519 | 4/1999 | (JP) . |

* cited by examiner

*Primary Examiner*—Richard Elms
*Assistant Examiner*—Pho Luu
(74) *Attorney, Agent, or Firm*—Pennie & Edmonds LLP

(57) ABSTRACT

This invention discloses a method of manufacturing a semiconductor device which comprises the steps of: forming gate electrodes on a semiconductor substrate having a cell region and a peripheral region; forming spacers at both side walls of the gate electrodes; implanting impurity into the semiconductor substrate of the peripheral region; forming a growth suppression layer on gate electrodes and surface of the semiconductor substrate in the peripheral region; forming doped epitaxial layers over predetermined portions of the semiconductor substrate in the cell region so that the impurity implanted into the semiconductor substrate in the peripheral region is diffused in the semiconductor substrate to form junction regions and impurity existing in the doped epitaxial layers of the cell region is diffused into the semiconductor substrate; and removing the growth suppression layer.

15 Claims, 3 Drawing Sheets

METHOD OF MANUFACTURING A SEMICONDUCTOR DEVICE

BACKGROUND OF THE INVENTION

1. Field of the Invention

This invention relates to a method of manufacturing a semiconductor device, in particular to a method of forming a junction region of a semiconductor device.

2. Description of the Related Prior Art

Generally, a semiconductor device has both regions of a cell region and a peripheral circuit region, in which the cell region has a high density since a plurality of devices are integrated while peripheral circuit region has a low density since some devices are disposed in spacing. Though the cell region and the peripheral circuit region have a same topology, aspect ratio of the cell region is higher than that of the peripheral circuit region. For example, when an etching process for forming a contact hole is performed, a junction region of the peripheral circuit is fully opened but a junction of the cell region is not opened due to the cell region a high integration and topology of a gate electrode.

In a conventional method, a junction region of the cell region is formed over a substrate to prevent contact defect. The conventional method will be described in conjunction with accompanying drawings.

Referring to FIG. 1A, field oxide layer 2 are formed on a semiconductor substrate 1, in which a cell region C and a peripheral region P are defined, by means of a conventional method. A gate insulation layer 3, a conductive layer 4 and a hard mask 5 are sequentially deposited on the semiconductor substrate 1 and patterned with a desired width to form gate electrodes.

Side wall spacers 6 are formed on both the side wall of the gate electrodes as shown in FIG. 1B. A silicon nitride layer 7 is then formed on the resulting structure alter forming the side wall spacers 6 and patterned to cover the peripheral region P.

As shown in FIG. 1C, doped epitaxial layers 8 are grown on the cell region C of the exposed semiconductor substrate 1 by means of a chemical vapor deposition process. Generally, the doped epitaxial layers 8 are not grown on an oxide layer and a silicon nitride layer. Hence, the doped epitaxial layers 8 are not formed on the field oxide layer 2, the hard mask 5, the side wall spacers 6 and the peripheral region P covered by the silicon nitride layer 7. The doped epitaxial layers 8 are only formed on a predetermined junction regions of the cell region C. Topology between the gate electrodes and the substrate in the cell region C is reduced by forming the epitaxial layers 8.

As shown in FIG. 1D, an impurity for a source and a drain is implanted into the substrate and a rapid thermal annealing is performed, thereby forming junction regions 9*a*, 9*b*, 9*c* and 9*d*. Since the peripheral region P is covered with a silicon nitride layer 7, the junction regions 9*c* and 9*d* are formed into thin thickness. Also, the impurity existing in the epitaxial layers 8 of cell region C is diffused into the semiconductor substrate 1 by means of the rapid thermal annealing so that the junction regions 9*a* and 9*b* are formed. Substantial junction regions of the cell region C are the junction regions 9*a* and 9*b* diffused into the substrate 1 and the epitaxial layers 8 formed on the substrate 1.

Referring to FIG. 1E, the silicon nitride layer 7 covering the semiconductor substrate 1 is removed by means a conventional method and an inter-insulation layer 10 is then formed on a resulting structure of the semiconductor substrate 1.

As described above, topology between the gate electrode and the junction region is reduced since the junction region of the cell region is formed over the substrate in the form of projection. Hence, a contact hole can be formed with easy.

However, there is a problem in that a threshold voltage of PMOS transistor, which is formed in a cell region or a peripheral region, is increased due to several times rapid thermal annealing. That is, the conventional method requires a high temperature during the growth of the epitaxial layer and the thermal process to form the junction region. As a result, threshold voltage of the PMOS transistor that is sensitive to thermal is changed.

SUMMARY OF THE INVENTION

Therefore, it is an object of the invention to provide a method of manufacturing a semiconductor device that can prevent change of device characteristic by reducing the number of the thermal process.

To achieve the above object, a method of manufacturing a semiconductor device according to the present invention, comprising the steps of:

- forming gate electrodes on a semiconductor substrate having a cell region and a peripheral region;
- forming spacers on both side walls of the gate electrodes;
- implanting impurity into the semiconductor substrate of the peripheral region;
- forming a growth suppression layer on gate electrodes and surface of the semiconductor substrate in the peripheral region;
- forming doped epitaxial layers over predetermined portions of the semiconductor substrate in a cell region so that the impurity implanted into the semiconductor substrate in the peripheral region is diffused in the semiconductor substrate to form junction regions and impurity existing in the doped epitaxial layers of the cell region is diffused into the semiconductor substrate; and
- removing the growth suppression layer.

The growth suppression layer is formed of a silicon nitride layer having 100 to 200 Å in which the silicon nitride layer is formed by means of a low pressure chemical vapor deposition process.

It is desirable that the spacer is formed of an oxide layer when the growth suppression layer is a silicon nitride layer.

The doped epitaxial layers are formed with thickness of 500 to 1500 Å and contain phosphorous therein.

In case of forming the doped epitaxial layers by means of a low pressure chemical vapor deposition process, the doped epitaxial layers are formed by performing a baking process for 1 to 5 minutes under temperature of 800 to 900 degrees Celsius and hydrogen environment and by performing a growing process for 3 to 10 minutes in in-situ with supplying of dichlorosilane (DCS) of 30 to 300 sccm, phosphine of 50 to 300 sccm and HCl of 30 to 200 sccm under pressure of 10 to 50 torr and temperature of 750 to 950 degrees Celsius.

In case of forming the doped epitaxial layers by means of an ultra high vacuum chemical vapor deposition, a deposition gas such as silane or disilane is used and it is performed under pressure less than 1 torr and temperature of 600 to 700 degrees Celsius.

It is desirable that a cleaning process is performed between the formation of the growth suppression layer and the formation of the doped epitaxial layers to remove a native oxide layer occurred to surface of the substrate the remaining growth suppression layer of the cell region. It is desirable that the cleaning process uses RCA cleaning, UV ozone cleaning or HF dipping processes. The gate electrodes are formed by sequentially forming a gate insulation layer, a conductive layer and a hard mask, and patterning a portion of the hard mask, the conductive layer, and the gate insulation layer.

BRIEF DESCRIPTION OF THE DRAWINGS

The aforementioned aspects and other features of the present invention will be explained in the following description, taken in conjunction with the accompanying drawing, wherein.

DETAILED DESCRIPTION OF THE INVENTION

This invention will be explained with reference to accompanying drawings.

FIGS. 2A to 2D are sectional views for explaining a method of manufacturing a semiconductor device according to the present invention.

Figure 1A:
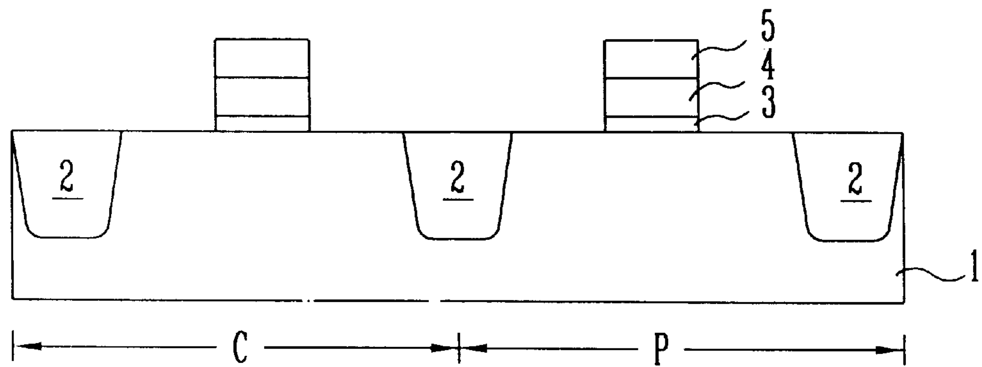
FIGS. 1A to 1E are sectional views for explaining a method of manufacturing a conventional semiconductor device.
Figure 1B:
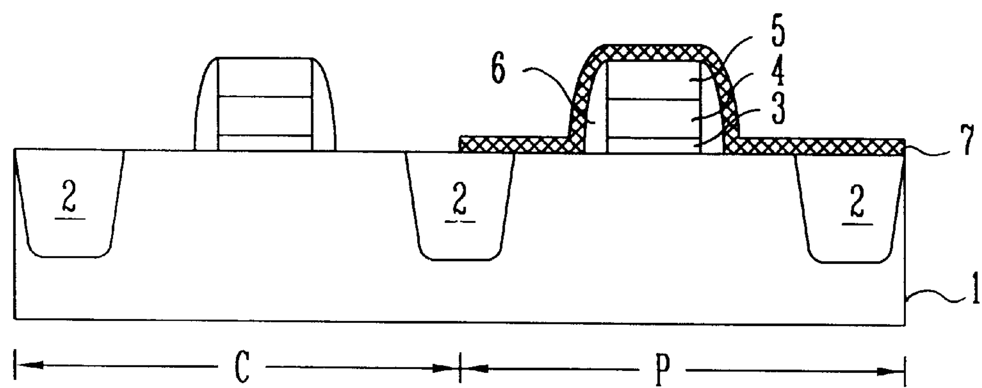
Figure 1C:
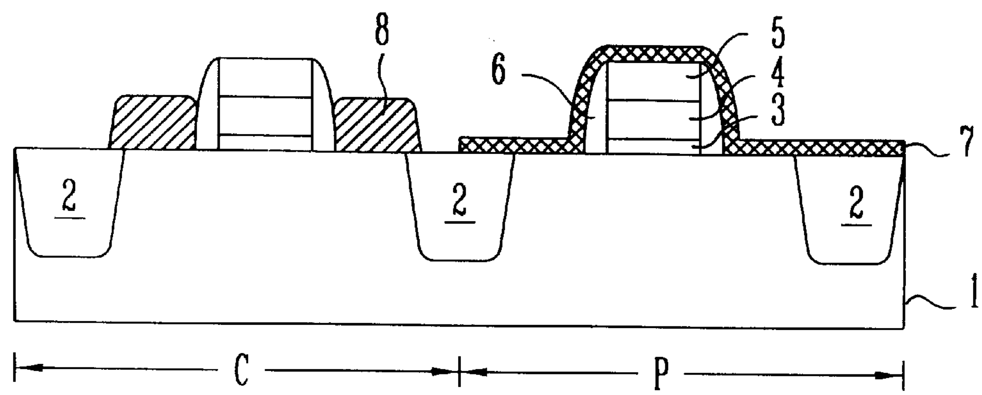
Figure 1D:
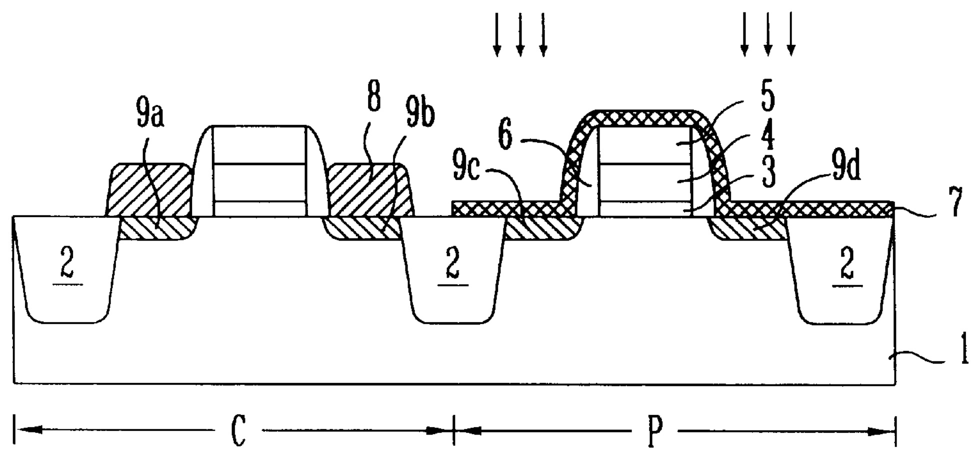
Figure 1E:
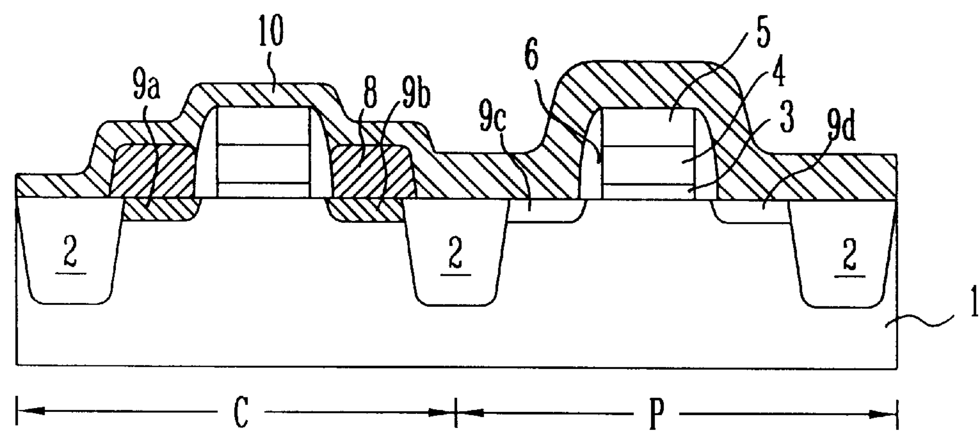
Figure 2A:
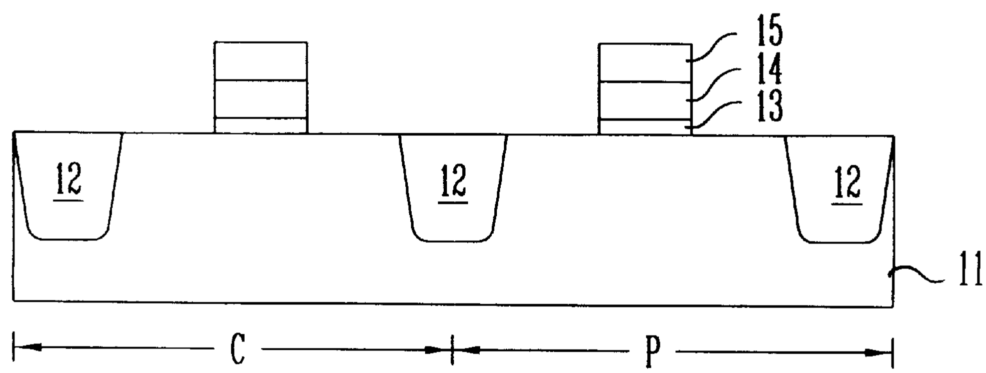
FIGS. 2A to 2D are sectional views for explaining a method of manufacturing a semiconductor device according to the present invention.

Referring to FIG. 2A, field oxide layer 12 are formed in predetermined portions of a semiconductor substrate 11 in which a cell region C and a peripheral region P are defined. A gate oxide layer 13, a conductive layer 14 and a hard mask 15 are sequentially formed on the semiconductor substrate 11 and a portion of gate oxide layer 13, the conductive layer 14 and the hard mask 15 are etched, thereby forming gate electrodes.

Figure 2B:
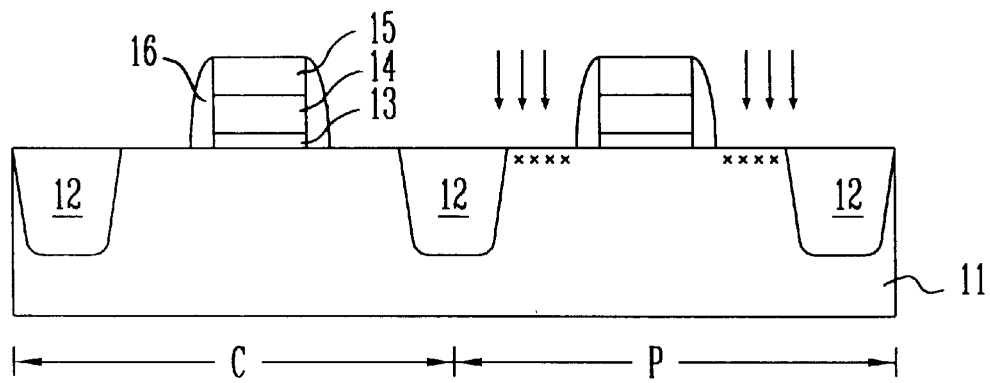

As shown in FIG. 2B, an oxide layer having thickness of 300 through 800 Å is deposited on a resulting structure after forming the gate electrodes and an anisotropic etching process is performed, whereby side wall spacers 16 are formed on both side walls of the gate electrodes. It is desirable that the side wall spacers 16 is formed with an oxide layer to prevent removing it together with a silicon nitride layer during the silicon nitride layer is etched, in which the silicon nitride layer will be formed by the subsequent process. An impurity for junction regions is selectively implanted into the semiconductor substrate 11 of the peripheral region P. In case of PMOS transistor, the impurity is $B^+$ or $BF_2^+$ ion, while in case of NMOS transistor, the impurity is $As^+$ or $P^+$ ion. The $B^+$ion is implanted with energy of 2 to 10 KeV and concentration of $10^{15}$ to $10^{17}$ ions/cm$^2$ and the $BF_2^+$ ion is implanted with energy of 10 to 30 KeV and concentration of $10^{15}$ to $10^{17}$ ions/cm$^2$. The $As^+$ion is implanted with energy of 10 to 30 KeV and concentration of $10^{15}$ to $10^{17}$ ions/cm$^2$ and the $P^+$ ion is implanted with energy of 10 to 30 KeV and concentration of $10^{15}$ to $10^{17}$ ions/cm$^2$.

Figure 2C:
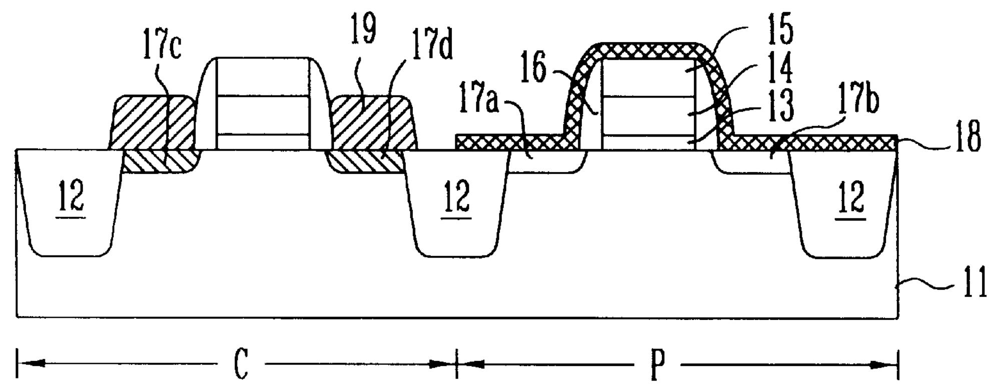

Referring to FIG. 2C, a silicon nitride layer 18 is formed on a resulting structure after implanting the impurity by means of a low pressure chemical vapor deposition process, in which the silicon nitride layer 18 is formed with thickness of 100 to 300 Å. The silicon nitride layer 18 of the cell region C is removed by means of a dry etching method, whereby the peripheral region P is only covered with the silicon nitride layer 18. It is desirable that the silicon nitride layer 18 is over etched below 100 percent to minimize a damage occurred to surface of the substrate 11 and to completely remove the silicon nitride layer 18 of the cell region C. The silicon nitride layer 18 act the part of a growth suppression layer.

Doped epitaxial layers 19 are grown on the semiconductor substrate 11 of the cell region C with thickness of 500 to 1500 Å. The doped epitaxial layers 19 are formed by a low pressure chemical vapor deposition or an ultra high vacuum chemical vapor deposition, in which the doped epitaxial layers 19 contain phosphorous. In case of forming the epitaxial layers 19 by means of the low pressure chemical vapor deposition, a baking process is performed for 1 to 5 minutes under temperature of 800 to 900 degrees Celsius and hydrogen environment prior to form the epitaxial layer. Continuously, the growing process is performed for 3 to 10 minutes in in-situ with supplying of dichlorosilane (DCS) of 30 to 300 sccm, phosphine of 50 to 300 sccm and HCl of 30 to 200 sccm under pressure of 10 to 50 torr and temperature of 750 to 950 degrees Celsius, thereby forming the epitaxial layers 19.

The ultra high vacuum chemical vapor deposition uses deposition gas such as silane or disilane and is performed under pressure less than 1 torr and temperature of 600 to 700 degrees Celsius.

The doped epitaxial layers 19 are not formed on the oxide layers 12, 15 and 17 and the silicon nitride layer 18, while it is only formed on a predetermined junction regions of cell region C. Since the thermal process is performed together with the formation of the doped epitaxial layers 19, the impurity implanted to the peripheral region P is diffused together with the formation of the doped epitaxial layers 19, thereby forming the junction regions 17*a* and 17*b*. Also, the impurity existing in the epitaxial layers 19 of cell region C is diffused into the semiconductor substrate 11 so that the junction regions 17*c* and 17*d* are formed. The substantial junction regions of the cell region C are the junction regions 17*c* and 17*d* formed in the substrate 11 and the epitaxial layers 19 formed over the surface of the substrate 11.

In the mean time, prior to the formation of the silicon nitride layer 18 and the doped epitaxial layers 19, RCA cleaning, UV ozone cleaning or HF dipping processes may be performed to remove residuals of the silicon nitride layer 18 and a native oxide layer.

Figure 2D:
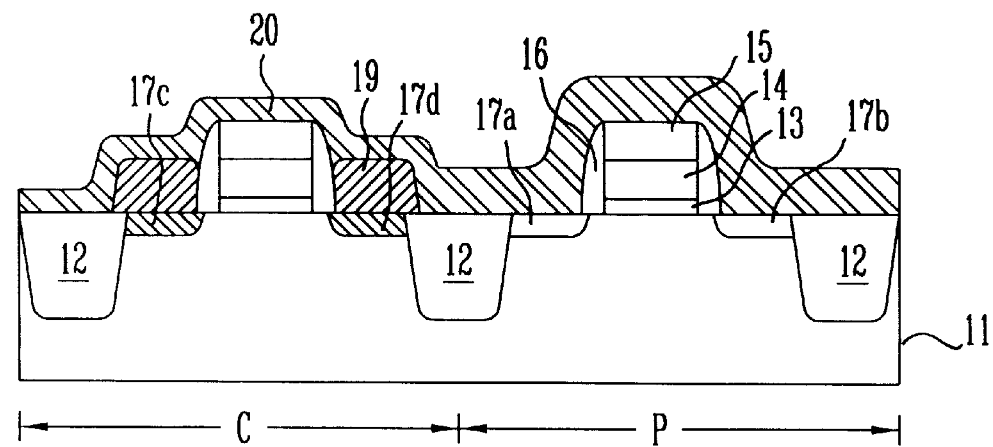

As shown in FIG. 2D, the silicon nitride layer 18 covering the peripheral region P is removed by a $H_3PO_4$ dipping process and an inter-insulation layer 20 is then formed on the resulting structure of the semiconductor substrate 11.

As described above, according to the present invention, the rapid thermal process to form the junction region is not necessary since the diffusion to form the junction region of the peripheral region is performed together with the formation of the epitaxial layer.

In addition, one thermal process may be omitted and thermal damage of a PMOS transistor is reduced, thereby reducing change of threshold voltage of the PMOS transistor.

Also, topology between a gate electrode and a junction region is reduced due to the formation of the doped epitaxial layer, whereby a contact hole may be formed with easy.

The present invention has been described with reference to a particular embodiment in connection with a particular application. Those having ordinary skill in the art and access to the teachings of the present invention will recognize additional modifications and applications within the scope thereof.

What is claimed is:

1. A method of manufacturing a semiconductor device, comprising the steps of:

forming gate electrodes on a semiconductor substrate having a cell region and a peripheral region;

forming spacers on both sidewalls of said gate electrodes;

implanting impurity into said semiconductor substrate of said peripheral region;

forming a growth suppression layer on gate electrodes and surface of said semiconductor substrate in said peripheral region;

forming doped epitaxial layers over predetermined portions of said semiconductor substrate in said cell region so that said impurity implanted into said semiconductor substrate in said peripheral region is diffused in said semiconductor substrate to form junction regions and impurity existing in said doped epitaxial layers of said cell region is diffused into said semiconductor substrate, wherein said doped epitaxial layers are formed by performing a baking process for 1 to 5 minutes under temperature of 800 to 900 degrees Celsius and hydrogen environment and by performing a growing process for 3 to 10 minutes in in-situ with supplying of dichlorosilane (DCS) of 30 to 300 sccm, phosphine of 50 to 300 sccm and HCl of 30 to 200 sccm under pressure of 10 to 50 torr and temperature of 750 to 950 degrees Celsius; and removing said growth suppression layer.

2. The method of claim 1, wherein said growth suppression layer is a silicon nitride layer formed of thickness 100 to 200 Å by means of a low pressure chemical vapor deposition process.

3. The method of claim 1, wherein said spacers are an oxide layer.

4. The method of claim 1, wherein said doped epitaxial layers are formed with thickness of 500 to 1500 Å.

5. The method of claim 1, wherein said doped epitaxial layers contain phosphorus therein.

6. A method of manufacturing a semiconductor device, comprising the steps of:

forming gate electrodes on a semiconductor substrate having a cell region and a peripheral region;

forming spacers on both sidewalls of said gate electrodes;

implanting impurity into said semiconductor substrate of said peripheral region;

forming a growth suppression layer on gate electrodes and surface of said semiconductor substrate in said peripheral region;

forming doped epitaxial layers over predetermined portions of said semiconductor substrate in said cell region so that said impurity implanted into said semiconductor substrate in said peripheral region is diffused in said semiconductor substrate to form junction regions and impurity existing in said doped epitaxial layers of said cell region is diffused into said semiconductor substrate, wherein said doped epitaxial layers are formed by any one gas of silane and disilane under pressure less than 1 torr and temperature of 600 to 700 degrees Celsius; and removing said growth suppression layer.

7. The method of claim 6, wherein said growth suppression layer is a silicon nitride layer formed of thickness 100 to 200 Å by means of a low pressure chemical vapor deposition process.

8. The method of claim 6, wherein said spacers are an oxide layer.

9. The method of claim 6, wherein said doped epitaxial layers are formed with thickness of 500 to 1500 Å.

10. The method of claim 6, wherein said doped epitaxial layers contain phosphorus therein.

11. A method of manufacturing a semiconductor device, comprising the steps of:

forming gate electrodes on a semiconductor substrate having a cell region and a peripheral region;

forming spacers on sidewalls of said gate electrodes;

implanting at least one type of impurity into said semiconductor substrate of the peripheral region;

forming a growth suppression layer on the gate electrodes and the surface of said semiconductor substrate in said peripheral region;

forming at least one doped epitaxial layer over exposed portions of said semiconductor substrate in said cell region by performing a thermal process using deposition silicon source gas, said thermal process also causing the impurity implanted into said peripheral region to diffuse and thereby form at least one junction region in said peripheral region, said thermal process further causing an impurity existing in said doped epitaxial layer to diffuse into said semiconductor substrate to thereby form at least one junction region in said cell region; and removing said growth suppression layer.

12. The method of claim 11, wherein said growth suppression layer is a silicon nitride layer formed with a thickness of 100 to 200 Å by means of a low pressure chemical vapor deposition process.

13. The method of claim 11, wherein said doped epitaxial layer is formed with thickness of 500 to 1500 Å.

14. The method of claim 11, wherein said doped epitaxial layer is formed by performing a baking process for 1 to 5 minutes under temperature of 800 to 900 degrees Celsius and hydrogen environment and by performing a growing process for 3 to 10 minutes in in-situ with supplying of dichlorosilane (DCS) of 30 to 300 sccm, phosphine of 50 to 300 sccm and HCl of 30 to 200 sccm under pressure of 10 to 50 torr and temperature of 750 to 950 degrees Celsius.

15. The method of claim 11, wherein said doped epitaxial layer is formed by any one gas of silane and disilane under pressure less than 1 torr and temperature of 600 to 700 degrees Celsius.

* * * * *